United States Patent [19]

Miyatake

[11] Patent Number: 4,918,301
[45] Date of Patent: Apr. 17, 1990

[54] POSITION SENSOR HAVING DOUBLE FOCUSES AND UTILIZING A CHROMATIC ABERRATION

[75] Inventor: Tsutomu Miyatake, Ehime, Japan

[73] Assignee: Sumitomo Heavy Industries, Ltd., Tokyo, Japan

[21] Appl. No.: 344,247

[22] Filed: Apr. 27, 1989

Related U.S. Application Data

[63] Continuation-in-part of Ser. No. 179,566, Apr. 18, 1988, abandoned.

[30] Foreign Application Priority Data

Jul. 8, 1987 [JP] Japan ............................ 62-196174

[51] Int. Cl.$^4$ .......................... G02B 5/22; H01J 3/14; H01J 5/16
[52] U.S. Cl. ..................................... 250/216; 350/316
[58] Field of Search ............... 250/216, 226, 201, 548; 356/400, 401; 350/311, 313, 316, 555

[56] References Cited

U.S. PATENT DOCUMENTS

| | | | |
|---|---|---|---|
| 3,990,789 | 11/1976 | White | 356/172 |
| 4,650,983 | 3/1987 | Suwa | 250/548 |
| 4,733,062 | 3/1988 | Horikawa et al. | 250/201 |
| 4,734,570 | 3/1988 | Horikawa et al. | 250/201 |
| 4,769,530 | 9/1988 | Miyahara | 250/201 |
| 4,856,905 | 8/1989 | Nishi | 250/548 |

FOREIGN PATENT DOCUMENTS 3413374 10/1985 Fed. Rep. of Germany .

OTHER PUBLICATIONS

European Search Report-Application Number EP 88 10 5743 listing documents No. DE-A-No. 3 413 374 and U.S. Pat. No. 3,990,798.

Primary Examiner—David C. Nelms
Assistant Examiner—William Oen
Attorney, Agent, or Firm—Fitch, Even, Tabin & Flannery

[57] ABSTRACT

An apparatus having double focuses and utilizing a chromatic aberration senses the positions observed in the direction perpendicular to a common optical axis of first and second objects separated from each other by a very small distance on the order of several microns to several tens of microns, such as the distance between a mask and a wafer in an X-ray exposure system. The apparatus is provided with a lens system for imaging the marks of the two objects in an identical plane by axial spherical visible light having two different wavelengths, and is also provided with a filter for cancelling blurring caused by chromatic aberration. The images of the respective marks are optically processed. Thus, the positional relationship observed in the direction perpendicular to a common optical axis of the two objects can be sensed by a single lens and thereby the small distance between the objects can be accurately set.

4 Claims, 7 Drawing Sheets

FIG. 8
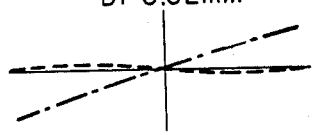
FIG. 8a
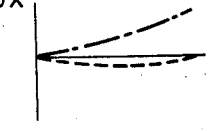
AXIAL SPHERICAL
CHROMATIC
ABERRATION
= 40 μm (GAP)
FIG. 8b
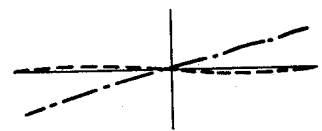
FIG. 8c
FIG. 8d
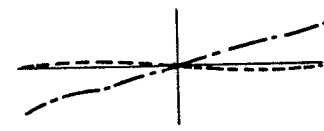
FIG. 8e  Y-COMA
ABERRATION
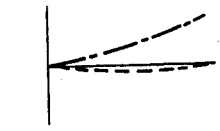
FIG. 8f  X-COMA
ABERRATION
FIG. 8g          FIG. 8h          FIG. 8i
         .05mm            .05mm           2%
SPHERICAL       ASTIGMATISM      DISTORTION
ABERRATION
(GEOMETRIC OPTICAL ABERRATION CURVES)
        PUPIL HEIGHT
FIG. 8a & 8b   0.052mm      ———— = e—line
FIG. 8c & 8d   0.037mm      ----- = g—line
FIG. 8e & 8f   0.000mm

FIG. 9
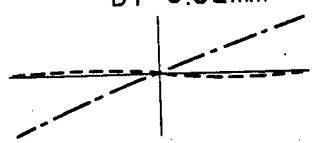
DY 0.02mm
FIG.9a
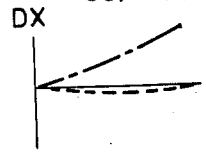
AXIAL SPHERICAL CHROMATIC ABERRATION = 50μm (GAP)
DX
FIG.9b
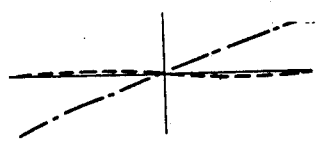
FIG.9c
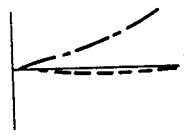
FIG.9d
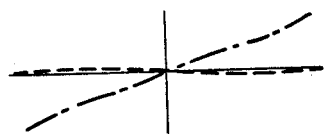
FIG.9e   Y-COMA ABERRATION
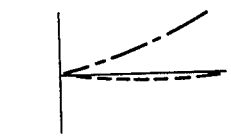
FIG.9f   X-COMA ABERRATION
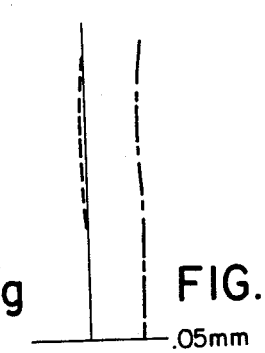
FIG.9g  FIG.9h
.05mm
SPHERICAL ABERRATION
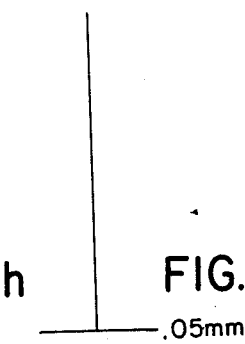
FIG.9i
.05mm
ASTIGMATISM
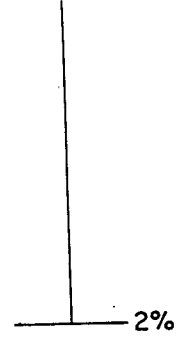
2%
DISTORTION

FIG. 10
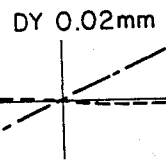
FIG.10a
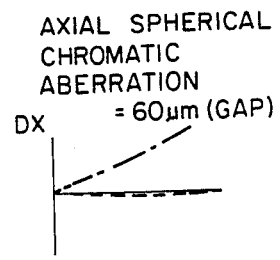
AXIAL SPHERICAL CHROMATIC ABERRATION
DX = 60μm (GAP)
FIG.10b
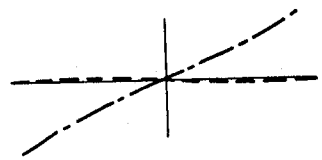
FIG.10c
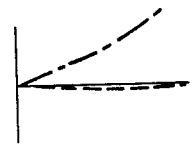
FIG.10d
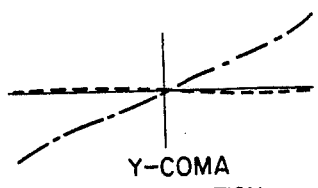
Y-COMA ABERRATION
FIG.10e
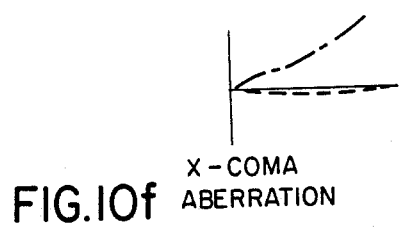
X-COMA ABERRATION
FIG.10f
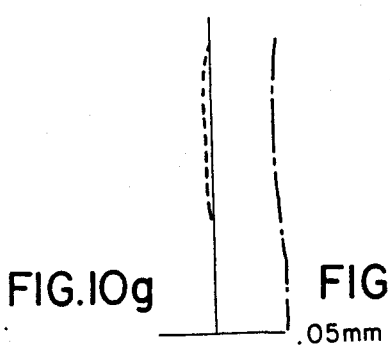
FIG.10g
SPHERICAL ABERRATION
.05mm
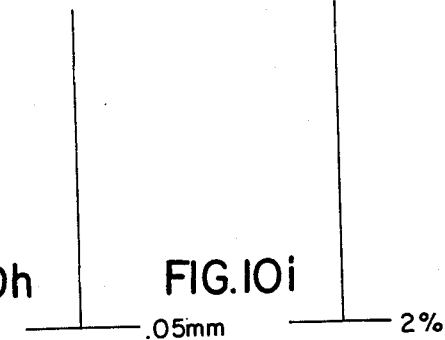
FIG.10h
ASTIGMATISM
.05mm
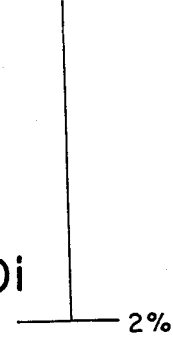
FIG.10i
DISTORTION
2%

POSITION SENSOR HAVING DOUBLE FOCUSES AND UTILIZING A CHROMATIC ABERRATION

RELATED APPLICATION

This is a continuation-in-part of U.S. application Ser. No. 179,566 filed Apr. 8, 1988 now abandoned.

BACKGROUND OF THE INVENTION

This invention relates to an apparatus having double focuses and utilizing a chromatic aberration for accurately sensing the positions observed in the direction perpendicular to a common optical axis of first and second objects separated from each other by a very short distance.

When a single objective lens is used to view the alignment marks of two spaced objects such as a mask and wafer for the purpose of proximity exposure, the gap between the two objects must be made small in order to improve resolving power. In general, if the settable gap is on the order of 10 microns, resolution must be reduced, thus making it impossible to detect the clear image necessary for highly accurate alignment.

Recently, however, detection systems have been proposed in which alignment can be achieved with great precision upon setting a gap of sufficient size between a mask and wafer, e.g., a gap of 10 microns or more. Two examples of such systems can be mentioned. The first is a detecting optical system that relies upon a double focal point lens utilizing the principle of double refraction (see "X-Ray Exposure Devices" in *Precision Machines*, 1985, vol. 51, No. 12, pp. 34–38). The second is a detecting optical system using rhombic detection (see the specification of Japanese Patent Application Laid-Open No. 61-100930).

Both of these conventional systems make possible highly precise detection by obtaining a clear image, despite a gap size of 10 microns or more. However, since polarized light is employed in the first optical system, the amount of optical information taken in is reduced to a fraction, often a very small fraction. The result is very low resolving power. In the second optical system, the angle between the object plane and the optic axis is not a right angle. Consequently, the area whose image is formed is reduced depending upon the angle and is narrowed to a fraction of the real field of view.

Here a detailed explanation of the relationship between resolving power and gap is in order. The resolving power and focal depth of a single objective lens are defined by the following Rayleigh equations:

$$\text{Resolving power} = 0.61 \times \lambda/NA \quad (1)$$

$$\text{Focal depth} = \lambda/2n(1-\cos\alpha) \quad (2)$$

where
$\lambda$: wavelength used,
NA: numerical aperture,
n : refractive index of medium,
$\alpha$: angular aperture.

It will be appreciated from Eqs. (1) and (2) that resolving power and focal depth are mutually contradictory in the sense that increasing one decreases the other. In other words, if an attempt is made to raise resolving power, focal depth is reduced. For example, letting NA $=0.40$, $\lambda=436$ nm, n $=1$ (air), we obtain a resolving power of 0.67 $\mu$m and a focal depth of 2.6 $\mu$m (range).

If an attempt is made to observe a mask and wafer simultaneously at this resolving power, the gap required would be less than 2.6 $\mu$m. This is a value which is not feasible in view of mask flatness, wafer flatness, the flatness of a process layer formed on the upper surface of the wafer, and an error involved in measuring the gap. The smallest gap presently obtainable in view of the foregoing is about 10 $\mu$m.

In order to set a gap of 10 $\mu$m, the required focal depth would be 10 $\mu$m or more. Accordingly, from Eq. (1), resolving power would be less than 1.1 $\mu$m in such case.

Thus, in order to realize highly precise alignment, it is necessary that the alignment marks of the mask and wafer be sensed with greater clarity by raising the resolving power of the objective lens in the detecting optical system. On the other hand, the focal depth must be increased in order to set the gap between the mask and wafer to a usable range (no less than about 10 $\mu$m). It is obvious from Eqs. (1) and (2), however, that both of these requirements cannot be satisfied simultaneously.

SUMMARY OF THE INVENTION

Accordingly, an object of the present invention is to provide an apparatus for sensing the positions of two spaced objects, wherein it is possible to obtain a depth of focus greater than a settable gap between the two objects upon assuring a sufficient resolving power for, e.g., highly precise alignment, while resolving power and focal depth abide by the foregoing Rayleigh equations.

According to the present invention, the foregoing object is attained by providing an apparatus having double focuses and utilizing a chromatic aberration for sensing the relative positions observed in the direction perpendicular to a common optical axis of first and second objects separated from each other by a small distance in the direction of the optical axis, the apparatus comprising:

a lens system for imaging a mark each of the first and second objects being accompanied by chromatic aberrations due to said small distance with first and second sets of lights having respective different wavelengths; a relative arrangement of the first and second objects and an objective lens in such a manner that the image plane of said first object occupied by the light of the first set of wavelengths is formed in a plane identical to the image plane of said second object occupied by the light of the second set of wavelengths; a filter means having first and second filter elements for cancelling the lights of the first and second sets of wavelengths respectively so as to cancel the image blur of the second object formed on the image plane of the second object due to the chromatic aberration caused by the light of the first set of wavelengths and the image blur of the first object formed on the image plane of the first object due to the chromatic aberration caused by the light of the second set of wavelengths. In particular, said chromatic aberration is an axial spherical chromatic aberration in the optical axis.

BRIEF DESCRIPTION OF THE DRAWINGS

FIGS. 8 through 10 are graphs showing aberration curves in accordance with first through third embodiments of the invention.

DETAILED DESCRIPTION

The principle of the invention will be explained before proceeding with a description of preferred embodiments.

In an actual optical system, an objective lens is accompanied by other lenses such as an eyepiece and relay lens to provide an image having a certain magnification. In order to explain the basic approach of the present invention, however, the discussion will be limited solely to a single objective lens. In addition, to simplify the discussion of the optical properties, a thin lens system will be dealt with and only paraxial formulae for a thin lens will be used. Initial Conditions:

(1) wavelengths used: $\alpha$, $\beta$(nm), where $\alpha < \beta$
(2) objective lens: N.A. $= NA$; magnification $= 10\times$; diameter d; angular aperture $\theta$; refractive indices for wavelengths 60, $\beta = R_\alpha$, $R_\beta$, respectively; focal points for wavelengths $\alpha$, $\beta = F_\alpha$, $F_\beta$, respectively
(3) distance (object distance) from principal point A to object $= S$
(4) distance (image distance) from principal point A to image plane $= S''_\alpha$(for wavelength $\alpha$); distance (image distance) from principal point A to image plane $= S''_\beta$(for wavelength $\beta$).

Figure 1:
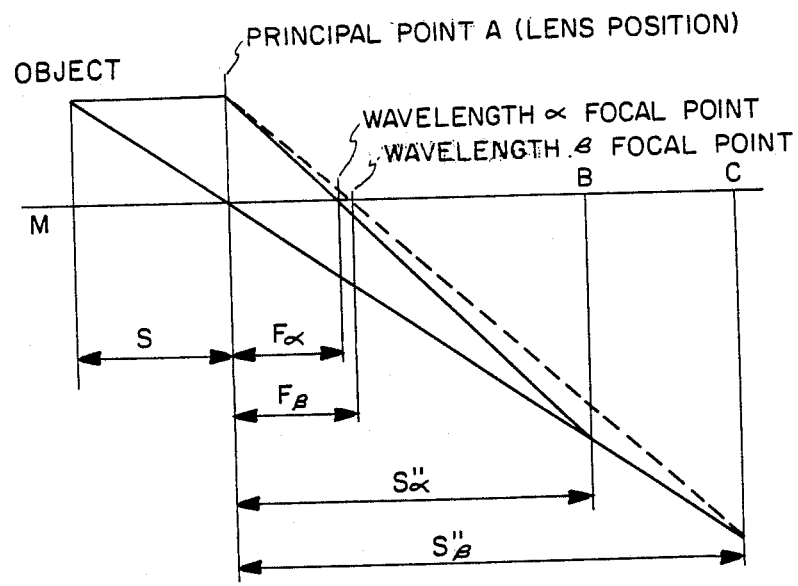
FIGS. 1 through 3 are graphs illustrating the principle of the present invention.

FIG. 1 illustrates the initial settings for the aforementioned conditions (1) through (4).

From conditions (1) and (2), the resolving powers and focal depths are as shown in Table 1, in accordance with the aforementioned Raleigh equations.

TABLE 1

| Wavelength | $\alpha$ | $\beta$ |
|---|---|---|
| Resolving power | $0.61 \times \alpha/NA$ | $0.61 \times \beta/NA$ |
| Focal depth | $\alpha/2(1 - \cos \alpha)$ | $\beta/2(1 - \cos \alpha)$ |

The lens position is referred to as the principal point, and this position is shown at A on the optical axis.

The object is situated on the left side of the lens at a position M located at a distance S from the principal point. Images for the respective wavelengths can be formed at points B and C on the side of the lens opposite the object.

The refractive index of the objective lens differs depending upon the wavelength; the shorter the wavelength, the higher the refractive index and, hence, the closer the focal point is to the lens. Accordingly, since the wavelengths are related by $\alpha < \beta$, the image for wavelength $\alpha$ is formed at point B, and the image for wavelength $\beta$ is formed at point C. Let $S''_\alpha$, $S''_\beta$ represent the distances of the respective images from the principal point.

Since the image planes are located at B and C in FIG. 1, let us consider forming the images in such a manner that the image planes occupy an identical arbitrary position on the optic axis. In order to simplify the development of the equations, it will be assumed that point C is moved to make it coincide with point B.

Figure 2:
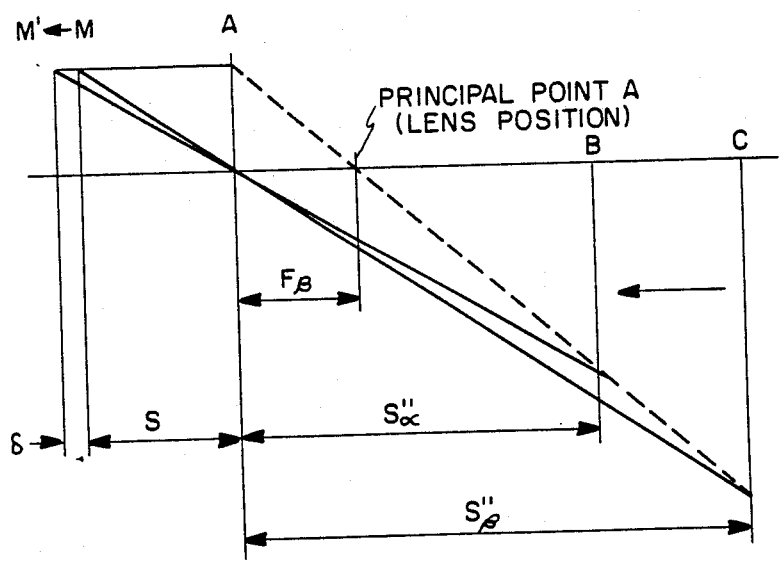

To bring point C into coincidence with point B, the position of the object should be moved leftward from M away from the principal point A, as is obvious from the arrangement shown in FIG. 1. FIG. 2 shows the result of such movement, with the new object position being designated M'.

The distance $\delta$ covered by movement of the object from point M to point M' in FIG. 2 is found. From Gauss' theorem, we have $$\frac{1}{S + \delta} + \frac{1}{S''_\alpha} = \frac{1}{F_\beta}$$

Solving this equation for $\delta$ gives us $$\delta = \frac{F_\beta \times S''}{S''_\alpha - F_\beta} - S \quad (3)$$

Magnification m is expressed by a value satisfying the following equation:

$$F_\beta = m \frac{(S + \delta + S''_\alpha)}{(m + 1)^2} \quad (4)$$

It is readily apparent from the foregoing that in order to make the imaging point C based on wavelength $\beta$ coincide with the point B, the position of the object should be moved from M to M' over a distance $\alpha$. This movement of the object is accompanied by a change in magnification, with the magnification of the image for the object at M' being mX.

Next, let us consider a case where objects are placed at both M and M' and the images of the objects are formed at point B by simultaneously irradiating them with light of the two wavelengths $\alpha$ and $\beta$.

In order to facilitate a more detailed discussion of the invention, it will be assumed that a mask is placed at point M, a wafer at point M', and the picture plane of a TV camera at the imaging point B. This state can be realized by supplementing FIG. 2 with the images of the mask (at point M) and wafer (at point M') with regard to the wavelength $\alpha$. The result is shown in FIG. 3.

Figure 3:
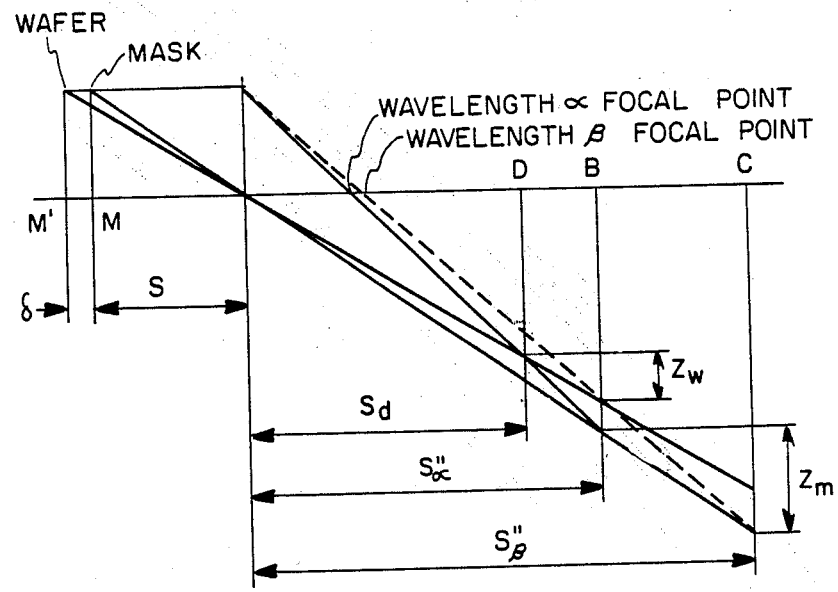

FIG. 3 differs from FIGS. 1 and 2 in that a new point D appears on the left side of point B. This point is that at which the image of the wafer (point M') is formed for wavelength $\alpha$. Letting Sd represent the distance of this point from the principal point A, we find Sd as follows:

$$\frac{1}{Sd} + \frac{1}{S + \delta} = \frac{1}{F_a}$$

Therefore, $$Sd = 1/\frac{1}{F_a} - \frac{1}{S + \delta} \quad (5)$$

The foregoing demonstrates that the image planes corresponding to the mask (point M) can be obtained at points B and C, and that the image planes corresponding to the wafer (point M') can be obtained at points D and B. In other words, it will be understood that the image planes for the two objects, namely the mask and the wafer, will coincide at the point B in FIG. 3. It should be noted that whereas the images at point B are in focus, the images of the wafer and mask at the respective points D and C appear blurred due to axial spherical chromatic aberration.

What actually appears on the image pick-up device for the state shown in FIG. 3 will now be considered.

Figure 4:
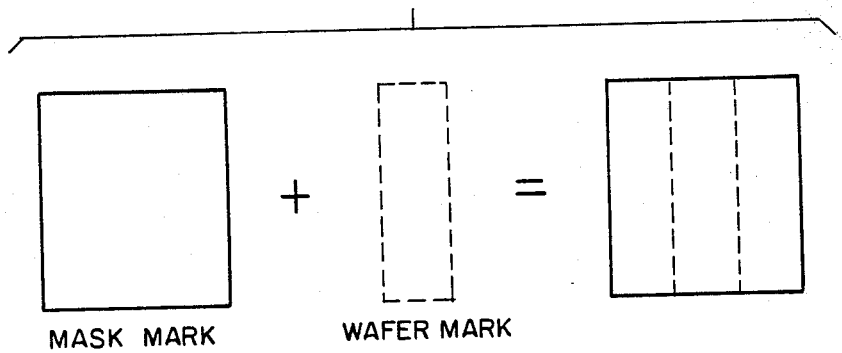
FIG. 4 is a schematic view illustrating an example of alignment marks of a mask and wafer.

Examples of the alignment marks for a mask and wafer are as shown in FIG. 4, in which the alignment marks are imagined to be rectangular and the shorter side of the mask mark is assumed to be greater than the shorter side of the wafer mark.

Figure 5:
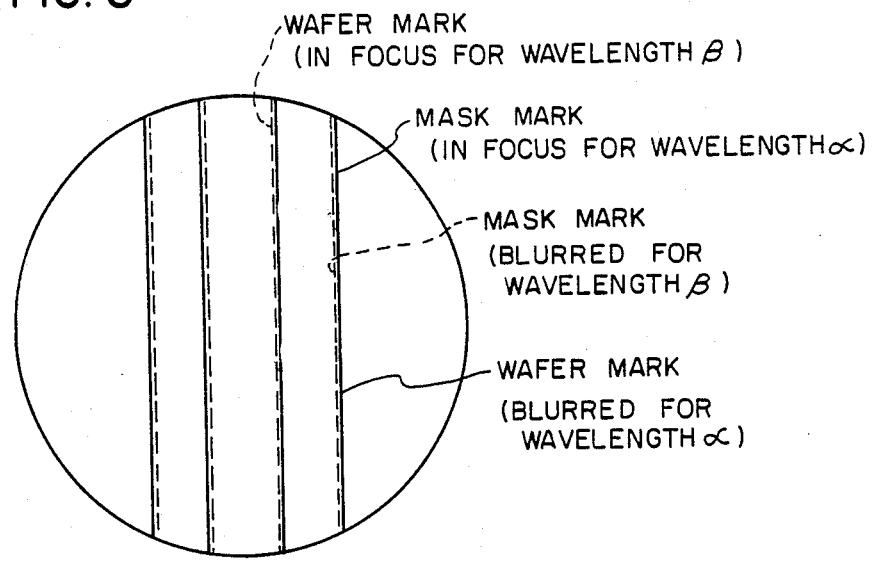
FIG. 5 is a schematic view illustrating how a superimposed mask and wafer appear on the screen of an image pick-up device.

With the mask and wafer of FIG. 4 superimposed, the patterns which appear on the picture tube screen along with blurring caused by axial spherical chromatic aberration are illustrated in FIG. 5. For the sake of convenience, the color associated with wavelength $\alpha$ is indicated by the solid lines, and the color associated with wavelength $\beta$ is indicated by the broken lines.

The chromatic aberrations of magnification associated with the mask and wafer shall be denoted by Zm and Zw and are obtained by using the following equations:

$$\frac{Zm}{h/2} = \frac{F_\beta - F_\alpha}{F_\beta} \therefore Zm = \frac{F_\beta - F_\alpha}{F_\beta} \cdot \frac{h}{2} \quad (6)$$

$$\frac{Zw}{h/2} = \frac{F_\beta - F_\alpha}{F_\alpha} \therefore Zw = \frac{F_\beta - F_\alpha}{F_\alpha} \cdot \frac{h}{2} \quad (7)$$

where h represents the length of the short side of the rectangular marks. In actuality, the blurring expressed by Eqs. (6) and (7) is determined geometrically in FIG. 3.

Figure 6:
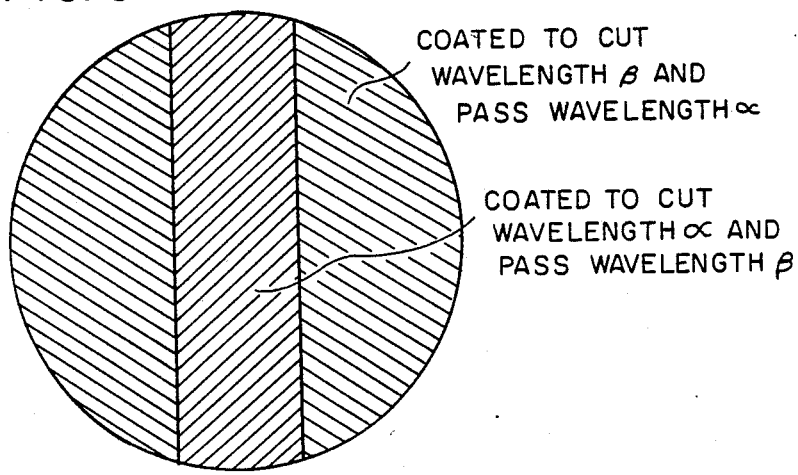
FIG. 6 is a schematic view illustrating one example of a filter.

A filter of the kind shown in FIG. 6 may be used to remove the blurred portions of FIG. 5. The filter illustrated in FIG. 6 is composed of two coated surfaces. One is a coated surface which passes only the light of wavelength $\alpha$, while the other is a coated surface which passes only the light of wavelength $\beta$. The design of the filter is decided in accordance with the state of the patterns shown in FIG. 5, and the boundaries of the coated surfaces are situated intermediate those of the mask marks and wafer marks.

Accordingly, if FIGS. 5 and 6 are superimposed, it will be apparent that, as regards the wafer marks, the axial spherical chromatic aberration due to wavelength $\alpha$ is cut by the filter so that a focused, clear image can be seen by virtue of wavelength $\beta$. Similarly, with regard to the mask mark, blurring due to wavelength $\beta$ is cut by the filter and a focused, clear image is obtained by virtue of wavelength $\alpha$. The mask and wafer marks are thus imaged on the screen of the image pick-up device. The resolving power and depth of focus of each image abide by the Rayleigh equations (1) and (2), and it is possible for the gap between the marks to be set freely without being constrained by Eq. (1).

An example of actual calculation based on Eqs. (3) through (7) will now be set forth.

Initial Conditions:
(1) wavelengths used: $\alpha = 436$ nm; $\beta = 587$ (nm)
(2) objective lens: NA = 0.4; magnification n = 10×; diameter d = 10 mm; angular aperture = 23.6; refractive indices $R_\alpha = 1.52669$, $R_\beta = 1.51472$; glass material: BK7; focal points $F_\alpha = 12.5$, $F_\beta = 12.741$
(3) S = 13.75
(4) S''$_\alpha$ = 137.5; S''$_\beta$ = 173.6146

| Resolving Power and Depth of Focus | | |
|---|---|---|
| Wavelength (nm) | Resolving Power ($\mu$m) | Depth of Focus ($\mu$m) |
| 436 | 0.66 | 2.7 |
| 587 | 0.895 | 3.7 |

Magnification Error:
  wafer image magnification = 9.792×
  mask image magnification = 10×
Wafer-Mask Gap: $\delta = 0.292$ mm
Chromatic Difference of Magnification:
  Mask: Zm = 7.71 $\mu$m
  Wafer: Zw = 7.56 $\mu$m, where h = 40 $\mu$m Magnification error is a factor which must be taken into consideration in terms of processing the images picked up by a detecting system based on this chromatic difference of magnification. Since reduction takes place owing to the magnification of 9.792× with regard to the wafer in the calculations exemplified above, it is required that the scaling constant for the wafer be increased at a ratio of 10:9.792 for a mask magnification of 10×. As for the filter, design should conform to the shapes or positions of the alignment masks.

It should be noted that chromatic difference of magnification for two-colored light (blue and yellow) naturally occurs in the principal plane of the objective lens. However, since the amount of this chromatic difference of magnification does not have an appreciable effect upon the gist of the invention, the present discussion will proceed neglecting such aberration.

A specific embodiment of lens design will now be described.

Figure 7:
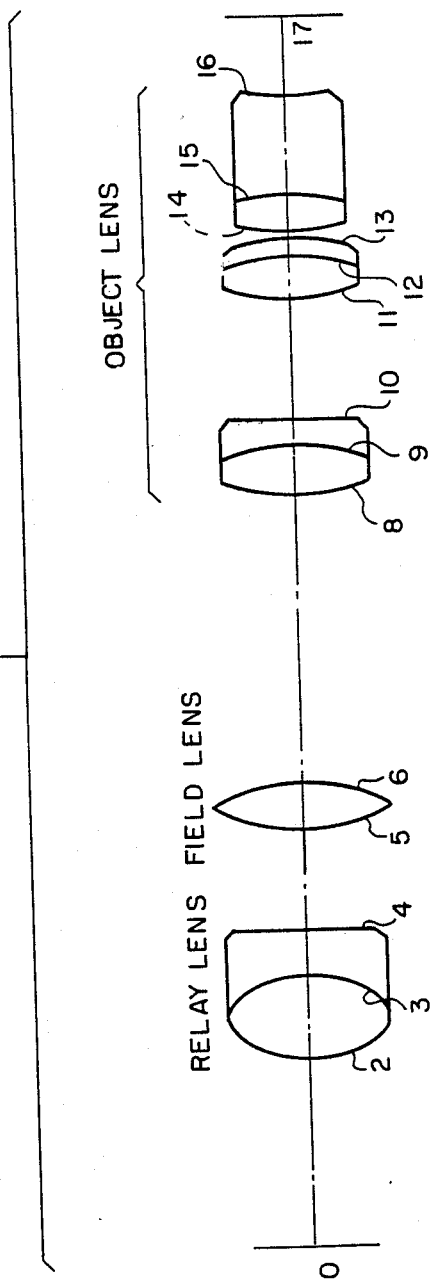
FIG. 7 is a schematic view illustrating a lens system embodying the present invention.

The overall arrangement of a lens system is illustrated in FIG. 7, in which a relay lens, field lens and objective lens are used in combination. The most important lens is the objective lens which, in the illustrated embodiment, is basically designed based on the system described in the specification of Japanese Patent Publication No. 43-15237. The present lens system is designed so as to employ two types of light beams, namely a g line (wavelength: 435.84 nm) and e line (wavelength: 546.07 nm).

Embodiment 1

Object-to-Object Distance = Axial spherical Chromatic Aberration = 40 $\mu$m

The objective lens specifications are shown in Table 2.

Data relating to lens curvature, center thickness, refractive index, glass material and stop for each of the lens system elements Nos. 1 through 17 are shown in Table 3. Also, the relationship between glass material and the refractive indices of the g and e lines are illustrated in Table 4. The Seidel's variable for the lens systems thus designed and arranged are indicated in Table 5.

It will be appreciated from the foregoing that these aberration values are very low and are fully corrected.

FIG. 8 illustrates the aberration curves. These curves also clearly show that the aberrations are well corrected.

TABLE 2

| Objective Lens Specifications | |
|---|---|
| Total optical path diameter | 488.135 |
| Focal length | −1.830 |
| Rear focal point | −0.731 |

TABLE 2-continued

Objective Lens Specifications

| | |
|---|---|
| Front focal point | 275.496 |
| Entrance pupil | 275.496 |
| Entrance diameter | 1.464 |
| Entrance magnification | −0.234 |
| Exit pupil | ***** |
| Exit magnification | ***** |
| Object distance | −1.000 |
| Magnification (reciprocal) | −0.666660D-02 |
| Image distance | 1.2202 |

TABLE 3

Data for Embodiment 1

| No. | Lens curvature | Center thickness | Refractive index | Glass material | Stop |
|---|---|---|---|---|---|
| 1 | 0.000 | 273.6350 | | | 0.00 |
| 2 | 21.133 | 1.2000 | 1.52621 | BK7 | 0.00 |
| 3 | −15.748 | 0.7000 | 1.72933 | SF15 | 0.00 |
| 4 | −35.884 | 35.2621 | | | 0.00 |
| 5 | 29.857 | 1.0000 | 1.52621 | BK7 | 0.00 |
| 6 | −29.857 | 155.8808 | | | 0.00 |
| 7 | 0.000 | −1.3458 | | | 3.13 |
| 8 | 12.174 | 2.5600 | 1.51989 | K1 | 0.00 |
| 9 | −8.533 | 1.2000 | 1.72944 | LAK8 | 0.00 |
| 10 | −73.985 | 6.0800 | | | 0.00 |
| 11 | 16.084 | 2.1600 | 1.58490 | BAF3 | 0.00 |
| 12 | −7.966 | 0.7440 | 1.75805 | LAF8 | 0.00 |
| 13 | −20.060 | 0.4160 | | | 0.00 |
| 14 | 7.433 | 2.0000 | 1.80839 | LASF01 | 0.00 |
| 15 | −33.638 | 4.8000 | 1.76190 | SF10 | 0.00 |
| 16 | 14.808 | 1.9387 | | | 0.00 |
| 17 | 0.000 | −0.7185 | | | 0.00 |

TABLE 4

Relationship between glass material and refractive index

| | | Refractive index | |
|---|---|---|---|
| No. | Glass material | g-line (435.84) | e-line (546.07) |
| 2 | BK7 | 1.52621 | 1.51825 |
| 3 | SF15 | 1.72933 | 1.70443 |
| 5 | BK7 | 1.52621 | 1.51825 |
| 8 | K1 | 1.51989 | 1.51173 |
| 9 | LAK8 | 1.72944 | 1.71615 |
| 11 | LF1 | 1.59026 | 1.57629 |
| 12 | LAF8 | 1.75805 | 1.73945 |

TABLE 4-continued

Relationship between glass material and refractive index

| | | Refractive index | |
|---|---|---|---|
| No. | Glass material | g-line (435.84) | e-line (546.07) |
| 14 | LASF01 | 1.80839 | 1.79013 |
| 15 | SF10 | 1.76190 | 1.73429 |

TABLE 5

Seidel's variable in Embodiment 1

| No. | Surface Aberration | Comatic Aberration | Astigmatism | Image surface curvature Aberration | Distortion | Petzval Aberration |
|---|---|---|---|---|---|---|
| 1 | 0.00000 | 0.00000 | 0.00000 | 0.00000 | 0.00000 | 0.00000 |
| 2 | −0.00020 | 0.00194 | −0.01899 | 0.04884 | 0.47842 | 0.02986 |
| 3 | 0.00050 | 0.00272 | 0.01489 | 0.02383 | 0.13042 | 0.00894 |
| 4 | 0.00046 | −0.00490 | −0.05167 | −0.07318 | −0.77169 | −0.02151 |
| 5 | 0.00000 | 0.00009 | −0.00362 | −0.02475 | −1.05363 | −0.02113 |
| 6 | 0.00000 | 0.00008 | 0.00247 | −0.01866 | 0.57849 | −0.02113 |
| 7 | 0.00000 | 0.00000 | 0.00000 | 0.00000 | 0.00000 | 0.00000 |
| 8 | −0.34045 | 0.10352 | −0.03148 | −0.08289 | 0.02521 | −0.05142 |
| 9 | 0.86166 | 0.12558 | 0.01830 | 0.03540 | 0.00516 | −0.01710 |
| 10 | −0.04013 | −0.03615 | −0.03256 | −0.04299 | −0.03873 | −0.01043 |
| 11 | 0.00226 | −0.00388 | 0.00667 | −0.03532 | 0.06071 | −0.04199 |
| 12 | 0.48235 | −0.07057 | 0.01032 | 0.02460 | −0.00360 | 0.01428 |
| 13 | −0.67360 | −0.03619 | −0.00194 | −0.04128 | −0.00222 | −0.03933 |
| 14 | 0.02401 | −0.04631 | −0.08933 | −0.02072 | −0.03997 | −0.11005 |
| 15 | −0.07025 | 0.01118 | −0.00178 | −0.00257 | −0.00041 | −0.00079 |
| 16 | −0.36922 | −0.04973 | −0.00670 | −0.04674 | −0.00630 | −0.05344 |
| 17 | 0.00000 | 0.00000 | 0.00000 | 0.00000 | 0.00000 | 0.00000 |
| SUM | −0.12353 | −0.00295 | −0.00675 | −0.26064 | −0.54478 | −0.25389 |

*Three-dimensional variables when total system focal length is normalized to 1 mm.

Embodiment 2

Object-to-Object Distance = Axial spherical Chromatic Aberration = 50 μm

The objective lens specifications are shown in Table 6.

Data relating to lens curvature, center thickness, refractive index, glass material and stop for each of the lens system elements Nos. 1 through 17 are shown in Table 7. The Seidel's variable for the lens systems thus designed and arranged are indicated in Table 8.

It will be appreciated from the foregoing that these aberration values are very low and are fully corrected.

FIG. 9 illustrates the aberration curves. These curves also show that the aberrations are well corrected.

TABLE 6

Objective lens Specifications

| | |
|---|---|
| Total optical path diameter | 487.722 |
| Focal length | −1.830 |
| Rear focal point | −0.731 |
| Front focal point | 275.496 |
| Entrance pupil | 275.496 |
| Entrance diameter | 1.464 |
| Entrance magnification | −0.235 |
| Exit pupil | ***** |
| Exit magnification | ***** |
| Object distance | −1.000 |
| Magnification (reciprocal) | −0.666660D-02 |
| Image distance | 1.1917 |

TABLE 7

Data for Embodiment 2

| No. | Lens curvature | Center thickness | Refractive index | Glass material | Stop |
|---|---|---|---|---|---|
| 1 | 0.000 | 273.5390 | | | 0.00 |
| 2 | 21.133 | 1.2000 | 1.52621 | BK7 | 0.00 |
| 3 | −15.748 | 0.7000 | 1.72933 | SF15 | 0.00 |
| 4 | −35.884 | 35.2621 | | | 0.00 |
| 5 | 29.857 | 1.0000 | 1.52621 | BK7 | 0.00 |
| 6 | −29.857 | 155.4240 | | | 0.00 |
| 7 | 0.000 | −1.3015 | | | 3.08 |
| 8 | 12.175 | 2.5600 | 1.51989 | K1 | 0.00 |
| 9 | −8.449 | 1.2000 | 1.72944 | LAK8 | 0.00 |
| 10 | −69.688 | 6.0800 | | | 0.00 |
| 11 | 16.591 | 2.1600 | 1.59861 | BAF3 | 0.00 |
| 12 | −7.842 | 0.7440 | 1.75805 | LAF8 | 0.00 |
| 13 | −20.385 | 0.4160 | | | 0.00 |
| 14 | 7.434 | 2.0000 | 1.80839 | LASF01 | 0.00 |
| 15 | −33.597 | 4.8000 | 1.76190 | SF10 | 0.00 |
| 16 | 14.455 | 1.9387 | | | 0.00 |
| 17 | 0.000 | −0.7470 | | | 0.00 |

TABLE 8

Seidel's variable in Embodiment 2

| No. | Surface Aberration | Comatic Aberration | Astigmatism | Image surface curvature Aberration | Distortion | Petzval Aberration |
|---|---|---|---|---|---|---|
| 1 | 0.00000 | 0.00000 | 0.00000 | 0.00000 | 0.00000 | 0.00000 |
| 2 | −0.00020 | 0.00194 | −0.01904 | 0.04889 | 0.47953 | 0.02985 |
| 3 | 0.00050 | 0.00271 | 0.01482 | 0.02376 | 0.12966 | 0.00894 |
| 4 | −0.00046 | −0.00489 | −0.05153 | −0.07304 | −0.76913 | −0.02151 |
| 5 | 0.00000 | 0.00009 | −0.00362 | −0.02475 | −1.05301 | −0.02113 |
| 6 | 0.00000 | 0.00008 | 0.00247 | −0.01866 | 0.57858 | −0.02113 |
| 7 | 0.00000 | 0.00000 | 0.00000 | 0.00000 | 0.00000 | 0.00000 |
| 8 | −0.33712 | 0.10348 | −0.03176 | −0.08317 | 0.02553 | −0.05141 |
| 9 | 0.87226 | 0.12550 | 0.01806 | 0.03532 | 0.00508 | −0.01727 |
| 10 | −0.04319 | −0.03781 | −0.03309 | −0.04416 | −0.03866 | −0.01107 |
| 11 | 0.00225 | −0.00470 | 0.00868 | −0.03262 | 0.06017 | −0.04130 |
| 12 | 0.45516 | −0.06912 | 0.01050 | 0.02373 | −0.00360 | 0.01324 |
| 13 | −0.66730 | −0.03585 | −0.00193 | −0.04063 | −0.00218 | −0.03870 |
| 14 | 0.02287 | −0.04550 | −0.09054 | −0.01949 | −0.03878 | −0.11003 |
| 15 | −0.06960 | 0.01124 | −0.00181 | −0.00261 | −0.00042 | −0.00079 |
| 16 | −0.36058 | −0.04975 | −0.00686 | −0.04788 | −0.00660 | −0.05474 |
| 17 | 0.00000 | 0.00000 | 0.00000 | 0.00000 | 0.00000 | 0.00000 |
| SUM | −0.12514 | −0.00291 | −0.00459 | −0.25733 | −0.54223 | −0.25274 |

*Three-dimensional variables when total system focal length is normalized to 1 mm.

FIG. 10 illustrates the aberration curves. These curves also show that the aberrations are well corrected.

TABLE 9

Objective Lens Specifications

| | |
|---|---|
| Total optical path diameter | 488.294 |
| Focal length | −1.830 |
| Rear focal point | −0.660 |
| Front focal point | 275.503 |
| Entrance pupil | 275.503 |
| Entrance diameter | 1.464 |
| Entrance magnification | −0.234 |
| Exit pupil | ***** |
| Exit magnification | ***** |
| Object distance | −1.000 |
| Magnification (reciprocal) | −0.666660D-02 |
| Image distance | 1.2906 |

TABLE 10

Data for Embodiment 3

Embodiment 3

Object-to-Object Distance = Axial spherical Chromatic Aberration = 60 μm

The objective lens specifications are shown in Table 9.

Data relating to lens curvature, center thickness, refractive index, glass material and stop for each of the lens system elements Nos 1 through 17 are shown in Table 10. The Seidel's variable for the lens systems thus designed and arranged are indicated in Table 11.

It will be appreciated from the foregoing that these aberration values are very low and are fully corrected.

| No. | Lens curvature | Center thickness | Refractive index | Glass material | Stop |
|---|---|---|---|---|---|
| 1 | 0.000 | 273.5390 | | | 0.00 |
| 2 | 21.133 | 1.2000 | 1.52621 | BK7 | 0.00 |
| 3 | −15.748 | 0.7000 | 1.72933 | SF15 | 0.00 |
| 4 | −35.884 | 35.2621 | | | 0.00 |
| 5 | 29.857 | 1.0000 | 1.52621 | BK7 | 0.00 |
| 6 | −29.857 | 156.0190 | | | 0.00 |
| 7 | 0.000 | −1.3244 | | | 3.13 |
| 8 | 12.242 | 2.5600 | 1.51989 | K1 | 0.00 |
| 9 | −8.507 | 1.2000 | 1.72944 | LAK8 | 0.00 |
| 10 | −69.688 | 6.0800 | | | 0.00 |
| 11 | 16.229 | 2.1600 | 1.59026 | LF1 | 0.00 |
| 12 | −7.936 | 0.7440 | 1.75805 | LAF8 | 0.00 |
| 13 | −20.134 | 0.4160 | | | 0.00 |
| 14 | 7.461 | 2.0000 | 1.80839 | LASF01 | 0.00 |
| 15 | −33.556 | 4.8000 | 1.76190 | SF10 | 0.00 |
| 16 | 14.777 | 1.9387 | | | 0.00 |
| 17 | 0.000 | −0.6481 | | | 0.00 |

TABLE 11

Seidel's variable in Embodiment 3

| No. | Surface Aberration | Comatic Aberration | Astigmatism | Image surface curvature Aberration | Distortion | Petzval Aberration |
| --- | --- | --- | --- | --- | --- | --- |
| 1 | 0.00000 | 0.00000 | 0.00000 | 0.00000 | 0.00000 | 0.00000 |
| 2 | −0.00020 | 0.00194 | −0.01897 | 0.04883 | 0.47808 | 0.02986 |
| 3 | 0.00050 | 0.00272 | 0.01492 | 0.02386 | 0.13065 | 0.00894 |
| 4 | −0.00046 | −0.00490 | −0.05172 | −0.07322 | −0.77246 | −0.02151 |
| 5 | 0.00000 | 0.00009 | −0.00362 | −0.02475 | −1.05382 | −0.02113 |
| 6 | 0.00000 | 0.00008 | 0.00247 | −0.01866 | 0.57847 | −0.02113 |
| 7 | 0.00000 | 0.00000 | 0.00000 | 0.00000 | 0.00000 | 0.00000 |
| 8 | −0.33667 | 0.10299 | −0.03150 | −0.08264 | 0.02528 | −0.05113 |
| 9 | 0.86881 | 0.12554 | 0.01814 | 0.03529 | 0.00510 | −0.01715 |
| 10 | −0.03240 | −0.03149 | −0.03060 | −0.03994 | −0.03882 | −0.00934 |
| 11 | 0.00158 | −0.00258 | 0.00422 | −0.03764 | 0.06144 | −0.04185 |
| 12 | 0.48553 | −0.07137 | 0.01049 | 0.02433 | −0.00358 | 0.01384 |
| 13 | −0.68198 | −0.03585 | −0.00188 | −0.04107 | −0.00216 | −0.03919 |
| 14 | 0.02626 | −0.04793 | −0.08748 | −0.02217 | −0.04046 | −0.10965 |
| 15 | −0.07038 | 0.01081 | −0.00166 | −0.00239 | −0.00037 | −0.00073 |
| 16 | −0.38561 | −0.05233 | −0.00710 | −0.04645 | −0.00630 | −0.05355 |
| 17 | 0.00000 | 0.00000 | 0.00000 | 0.00000 | 0.00000 | 0.00000 |
| SUM | −0.12502 | −0.00261 | −0.00934 | −0.26139 | −0.54470 | −0.25205 |

*Three-dimensional variables when total system focal length is normalized to 1 mm.

What is claimed is:

1. In an apparatus having double focuses and utilizing a chromatic aberration for sensing the relative positions observed in the direction perpendicular to a common optical axis of first and second objects separated from each other by a small distance in the direction of the optical axis, the apparatus comprising:

a lens system for imaging a mark each of the first and second objects being accompanied by chromatic aberrations due to said small distance with first and second sets of lights having respective different wavelengths; a relative arrangement of the first and second objects and an objective lens in such a manner that the image plane of said first object occupied by the light of the first set of wavelengths is formed in a plane identical to the image plane of said second object occupied by the light of the second set of wavelengths; a filter means having first and second filter elements for cancelling the lights of the first and second sets of wavelengths respectively so as to cancel the image blur of the second object formed on the image plane of the second object due to the chromatic aberration caused by the light of the first set of wavelengths and the image blur of the first object formed on the image plane of the first object due to the chromatic aberration caused by the light of the second set of wavelengths.

2. The apparatus according to claim 1, wherein said chromatic aberration due to said small distance is an axial spherical chromatic aberration in the optical axis.

3. An apparatus for sensing the positions of first and second objects separated from each other by a very small distance, comprising:

a lens system designed in accordance with the distance between the first and second objects and visible light having first and second suitably set wavelengths for imaging, in an identical plane, a mark of the first object by the visible light of the first wavelength and a mark of the second object by the visible light of the second wavelength;

a filter for cancelling light other than the light for imaging, said filter conforming to positions of the respective imaged marks of the first and second objects; and a processing system for processing images passed by said filter and indicating a positional relationship between the first and second objects.

4. The apparatus according to claim 3, wherein said filter comprises:

a first coated surface for passing only the light of the first wavelength; and a second coated surface for passing only the light of the second wavelength.

* * * * *

UNITED STATES PATENT AND TRADEMARK OFFICE
CERTIFICATE OF CORRECTION

PATENT NO. : 4,918,301
DATED : April 17, 1990
INVENTOR(S) : Tsutomu Miyatake

It is certified that error appears in the above-identified patent and that said Letters Patent is hereby corrected as shown below:

In Column 3, line 28, change the numeral "60" to read the Greek letter --$\alpha$--.

In Column 7, line 35, delete the spaces separating "Image distance 1.2202" from other information in "Table 2".

In Column 7, line 41, change "273.6350" to read --273.5350--.

In Column 9, line 58, change "60 $\mu$ m" to read --60 $\mu$m--.

In Column 9, line 64, change "Nos" to read --Nos.--.

Signed and Sealed this

Seventh Day of April, 1992

Attest:

HARRY F. MANBECK, JR.

*Attesting Officer*        *Commissioner of Patents and Trademarks*

UNITED STATES PATENT AND TRADEMARK OFFICE
CERTIFICATE OF CORRECTION

PATENT NO.   :   4,918,301

DATED        :   April 17, 1990

INVENTOR(S)  :   Miyatake

It is certified that error appears in the above-identified patent and that said Letters Patent is hereby corrected as shown below:

ON THE TITLE PAGE:

[30] Foreign Application Priority Date, change "Jul. 8, 1987" to --Aug. 7, 1987--.

Signed and Sealed this

Tenth Day of November, 1992

Attest:

DOUGLAS B. COMER

*Attesting Officer*   *Acting Commissioner of Patents and Trademarks*